(12) United States Patent
Sasaki et al.

(10) Patent No.: US 7,645,481 B2
(45) Date of Patent: Jan. 12, 2010

(54) FABRICATION OF LOW DIELECTRIC CONSTANT INSULATING FILM

(75) Inventors: Masaru Sasaki, Amagasaki (JP); Satohiko Hoshino, Nirasaki (JP); Shinji Ide, Amagasaki (JP); Yusaku Kashiwagi, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 564 days.

(21) Appl. No.: 10/572,477

(22) PCT Filed: Sep. 17, 2004

(86) PCT No.: PCT/JP2004/013644

§ 371 (c)(1),
(2), (4) Date: Mar. 17, 2006

(87) PCT Pub. No.: WO2005/029565

PCT Pub. Date: Mar. 31, 2005

(65) Prior Publication Data
US 2007/0098890 A1 May 3, 2007

(30) Foreign Application Priority Data
Sep. 17, 2003 (JP) ............................ 2003-325010
Dec. 9, 2003 (JP) ............................ 2003-410795

(51) Int. Cl.
C23C 16/00 (2006.01)
C04B 41/00 (2006.01)
C30B 28/12 (2006.01)
C30B 17/00 (2006.01)

(52) U.S. Cl. ..................... 427/248.1; 427/532; 427/569; 117/92; 117/95; 117/103; 117/104

(58) Field of Classification Search ............. 427/248.1, 427/569, 532; 117/92, 95, 103–104
See application file for complete search history.

(56) References Cited

U.S. PATENT DOCUMENTS 5,846,612 A * 12/1998 Takaki et al. ................. 427/569

(Continued)

FOREIGN PATENT DOCUMENTS

EP 1361605 A1 11/2003

(Continued)

OTHER PUBLICATIONS

European Office Action issued on Aug. 6, 2008 for EP Application No. 04 773 278.9.

(Continued)

Primary Examiner—Robert M Kunemund
Assistant Examiner—G. Nagesh Rao
(74) Attorney, Agent, or Firm—Smith, Gambrell & Russell, LLP

(57) ABSTRACT

The present invention relates to a method of lowering dielectric constant of an insulating film including Si, O and CH formed by a chemical vapor deposition process. A process gas containing hydrogen atoms is supplied into a reaction vessel. A microwave is introduced into the reaction vessel to supply a uniform electromagnetic wave, thereby a plasma containing a hydrogen radical is generated in the reaction vessel. The structure of the insulating film is modified by the hydrogen radical contained in the plasma irradiated to the insulating film, lowering the dielectric constant of the film. The microwave is supplied into the reaction vessel through a radial-slot antenna.

10 Claims, 7 Drawing Sheets

U.S. PATENT DOCUMENTS

| | | | |
|---|---|---|---|
| 6,020,458 A * | 2/2000 | Lee et al. | 528/401 |
| 6,870,123 B2 * | 3/2005 | Suzuki et al. | 219/121.43 |
| 6,890,605 B2 | 5/2005 | Nishikawa et al. | |
| 2001/0019857 A1 | 9/2001 | Yokoyama et al. | |
| 2001/0054605 A1 * | 12/2001 | Suzuki et al. | 219/121.43 |
| 2002/0142104 A1 | 10/2002 | Nemani et al. | |
| 2002/0164429 A1 | 11/2002 | Gaillard et al. | |
| 2003/0066482 A1 | 4/2003 | Pokharna et al. | |
| 2006/0223306 A1 * | 10/2006 | Kawamura et al. | 438/637 |
| 2007/0098890 A1 * | 5/2007 | Sasaki et al. | 427/248.1 |

FOREIGN PATENT DOCUMENTS

| | | |
|---|---|---|
| JP | 2000-058536 | 2/2000 |
| JP | 2000-106438 | 4/2000 |
| JP | 2000-216153 | 8/2000 |
| JP | 2003-179050 | 6/2003 |
| JP | 2004-152794 | 5/2004 |
| JP | 2004-158794 | 6/2004 |
| JP | 2004-200626 | 7/2004 |
| WO | WO 01/01472 A1 | 1/2001 |
| WO | WO 02/058130 A1 | 7/2002 |

OTHER PUBLICATIONS

Japanese Office Action issued on Jul. 15, 2008 with partial English translation.

Supplementary European search report for Appln No. PCT/JP2004013644 dated May 6, 2008.

Notification of Transmittal of Translation of the International Preliminary Report on Patentability (Form PCT/IB/338)—PCT/JP2004/013644, dated Jan. 2004.

PCT International Preliminary Report on Patentability (Form PCT/IB/373)—PCT/JP2004/013644, dated Jan. 2004.

Translation of PCT Written Opinion of the International Searching Authority (PCT/ISA/237)—PCT/JP2004/013644, dated Jan. 2004.

Japanese Office Action issued on Apr. 28, 2009 for Japanese Patent Application No. 2003-410795 with English translation.

* cited by examiner

| | CURING PROCESS | | | | | | |
|---|---|---|---|---|---|---|---|
| | PRESSURE (Torr) | Ar (sccm) | H2 (sccm) | POWER (kW) | TEMPERATURE (deg.C) | GAP (mm) | TIME (sec) |
| #1 | BEFORE PROCESSED | | | | | | |
| #2 | 0.5 | 1000 | 100 | 2 | 350 | 105 | 60 |
| #3 | 0.5 | 1000 | 100 | 2 | 400 | 105 | 60 |
| #4 | 0.5 | 1000 | 100 | 2 | 350 | 105 | 60 |
| #5 | 0.5 | 1000 | 100 | 2 | 400 | 105 | 60 |
| #6 | 2.0 | 250 | 500 | 2 | 400 | 55 | 60 |

FIG. 8

FABRICATION OF LOW DIELECTRIC CONSTANT INSULATING FILM

TECHNICAL FIELD

The present invention relates to a low dielectric constant (low-k) insulating film, and more specifically to a technique for lowering the dielectric constant of an insulating film by processing it with plasma.

BACKGROUND ART

With high integration of semiconductor integrated circuits, increase of interconnect-delay due to increase of interconnect-capacitance, namely, parasitic capacitance between metallic wires, prevents the performance gain of semiconductor integrated circuits. The interconnect-delay is proportional to the product of the resistance of metallic wires and the interconnect-capacitance. In order to reduce the interconnect-delay by reducing the resistance of metallic wires, copper (Cu) having a high conductivity is recently used in place of previously-used aluminum (Al).

On the other hand, the dielectric constant (k) of an interlayer insulating film formed between the metallic wires may be lowered to decrease the interconnect-capacitance. In order to achieve a lower dielectric constant, a porous insulating film is used in place of a conventional silicon-oxide film, or an air gap is formed.

Various methods are possible to form a porous film. JP2000-216153A discloses that a porous film having a dielectric constant not more than 2 is formed by a plasma chemical vapor deposition (CVD) process (paragraph 0013, FIG. 2). In this method, an organic-inorganic composite film is deposited on a substrate by a plasma CVD process, which employs a mixed gas of silicon alkoxide and an organic compound as a reaction gas. A porous film of an organic-inorganic composite film is made: by performing a plasma process to the organic-inorganic composite film by using a plasma processing system of a parallel-plate type with generating a plasma originated from a gas containing a reducing gas; or by heat-treating the organic-inorganic composite film in an atmosphere containing a reducing gas.

However, the above method does not modify the structure of the interlayer insulating film itself, but just vaporizes almost the organic components in the organic-inorganic composite film to make Si—H bonds by a plasma treatment or a heat treatment, thereby to form a number of fine pores at sites from which organic components have been vaporized. The film after processed becomes porous, and thus the film shrinks, resulting in reduction of the film thickness and deterioration in adhesion of the film due to increase of the film hardness.

SUMMARY OF THE INVENTION

The main object of the present invention is to provide a method of lowering the dielectric constant of an insulating film without reducing the film-thickness, or of lowering the dielectric constant of an insulating film while improving the adhesion of the film by maintaining the film-hardness to the extent that the pattern thereof as formed can be maintained.

The further object of the present invention is to provide a semiconductor device provided with a low-k (low dielectric constant) insulating film having a high hardness at least in the surface portion thereof.

The further object of the present invention is to provide a processing system (low-k insulating film forming system) which is capable of performing the above method.

The further object of the present invention is to provide a storage medium storing software which is to be executed by a computer that controls a processing system to make the system perform the above method.

The present invention provides a method of forming a low-k insulating film, which includes the steps of: placing a substrate, on which an insulating film containing Si, O and CH is deposited by a chemical vapor deposition process, in a reaction vessel; supplying a process gas containing hydrogen atoms into the reaction vessel and supplying a microwave into the reaction vessel, thereby generating a plasma containing hydrogen radicals; and modifying a structure of the insulating film deposited on the substrate by means of the hydrogen radical contained in the plasma, thereby lowering a dielectric constant of the insulating film.

In one embodiment, the step of lowering the dielectric constant of the insulating film includes a step of expanding the insulating film deposited on the substrate by means of the hydrogen radical contained in the plasma.

In one embodiment, the step of lowering the dielectric constant of the insulating film includes a step of substituting intermolecular bonds of a long interatomic distance for intermolecular bonds of a short interatomic distance constituting the insulating film.

In one embodiment, the step of lowering the dielectric constant of the insulating film includes a step of removing a molecule in an intermolecular bond to modify the molecule to be of a ladder-type molecular structure.

In one embodiment, the step of lowering the dielectric constant of the insulating film includes a step of removing a hydroxyl group from a molecule constituting the insulating film, and removing a methyl group from another molecule constituting the insulating film, and combining an hydrogen (H) element of the hydroxyl group thus removed with the methyl thus removed to vaporize a resultant methane, while retaining an oxygen (O) element of the hydroxyl group.

In one embodiment, the step of lowering the dielectric constant of the insulating film includes a step of increasing an amount of component molecules having a large dipole moment.

In one embodiment, the step of increasing the amount of component molecules having a large dipole moment includes a step of increasing an amount of Si—H bonds while decreasing an amount of Si—$CH_3$ bonds.

In one embodiment, the step of increasing the number of component molecules having the large dipole moment includes a step of substituting H for $CH_3$ in a Si—$CH_3$ bond.

In one embodiment, in the step of generating the plasma, the microwave is introduced into the reaction vessel through a radial-slot antenna comprising a circular disk having a plurality of slits formed therein, whereby a substantially uniform electric field is formed in the reaction vessel.

The present invention further provides a method of forming a low-k insulating film, which includes the steps of: placing a substrate, on which an insulating film containing Si, O and CH is deposited by a chemical vapor deposition process under a process temperature of 100° C. or below, in a reaction vessel; supplying a process gas containing hydrogen atoms into the reaction vessel and supplying an electromagnetic wave into the reaction vessel, thereby generating a plasma containing hydrogen radicals; and modifying a structure of the insulating film deposited on the substrate by means of the hydrogen radicals contained in the plasma, thereby lowering a dielectric constant of the insulating film.

The present invention further provides a method of forming a low-k insulating film, which includes the steps of: placing a substrate, on which an insulating film containing Si, O and CH is deposited by a chemical vapor deposition process, in a reaction vessel; supplying hydrogen gas and argon gas only into the reaction vessel supplying an electromagnetic wave into the reaction vessel, thereby generating a plasma containing hydrogen radicals; and modifying a structure of the insulating film deposited on the substrate by means of the hydrogen radicals contained in the plasma, thereby lowering a dielectric constant of the insulating film.

The present invention further provides a plasma processing system which includes: a reaction vessel; a pedestal arranged on the reaction vessel to place a substrate thereon; a heater adapted to heat the substrate placed on the pedestal; a microwave supplying means for supplying a microwave into the reaction vessel; a gas supplying means for supplying a gas containing hydrogen into the reaction vessel; an exhaust means for regulating pressure in the reaction vessel; and a controller configured to control, when a substrate on which an insulating film containing Si, O and CH is formed is placed on the pedestal, the heater, the microwave supplying means, the gas supplying means and the exhaust means to generate a plasma containing hydrogen radicals under predetermined process conditions which enable lowering a dielectric constant of the insulating film formed on the substrate.

The present invention further provides a storage medium storing a software executable by a control computer of a plasma processing system, wherein, upon execution of the software, the control computer controls the plasma processing system to make the system perform a plasma processing method that reduces a dielectric constant of an insulating film including Si, O and CH deposited by a chemical vapor deposition process, wherein said plasma processing method includes the steps of: supplying a process gas containing hydrogen atoms into the reaction vessel and supplying an electromagnetic wave into the reaction vessel, thereby generating a plasma containing a hydrogen radical; and modifying a structure of the insulating film deposited on the substrate by means of the hydrogen radical contained in the plasma, thereby lowering a dielectric constant of the insulating film.

BRIEF DESCRIPTION OF THE DRAWINGS

FIG. 8 is a table showing process conditions of the plasma processes; and

EXPLANATION OF REFERENCE SIGNS

Figure 1:
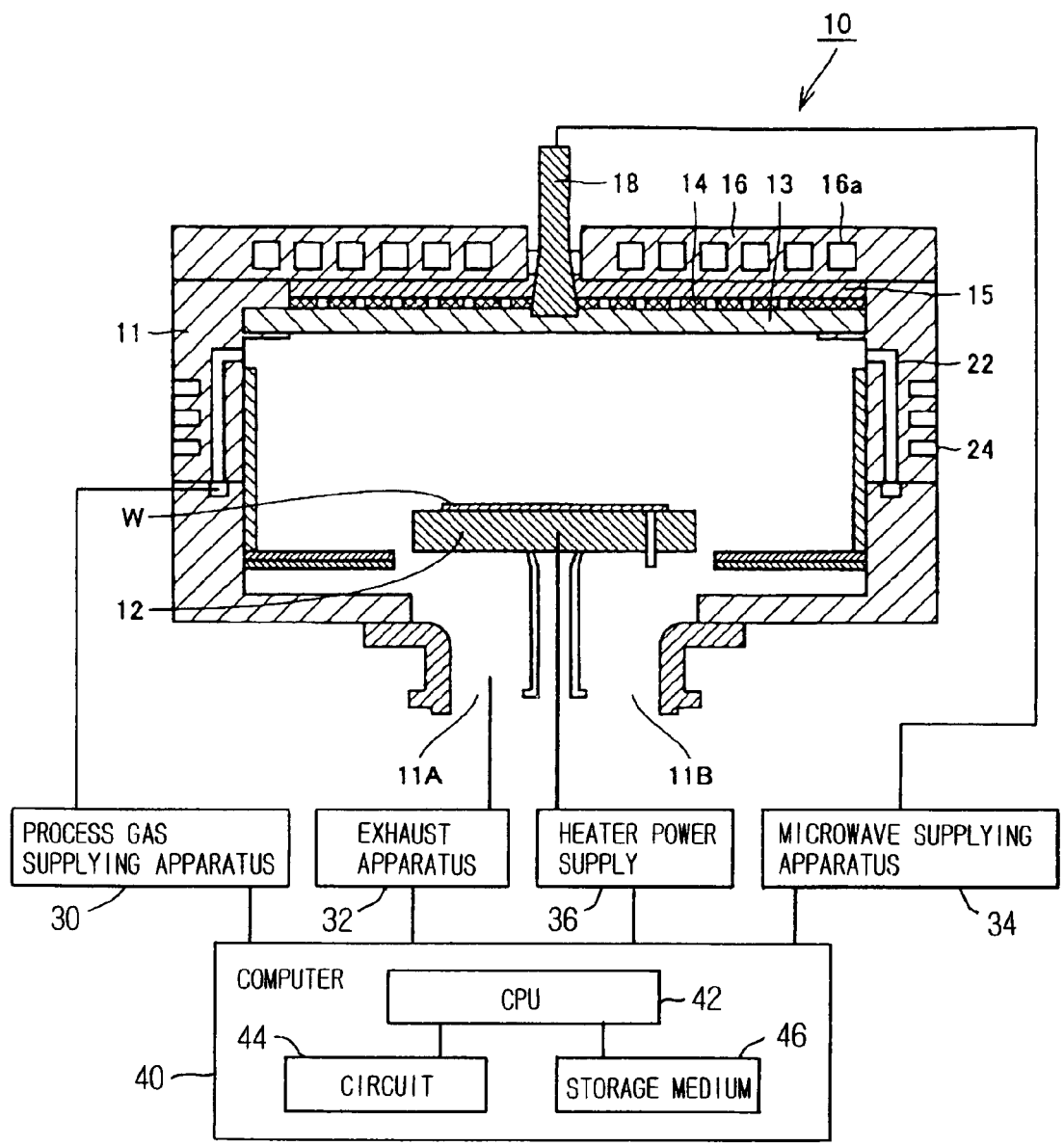
FIG. 1 is a cross-sectional view of a plasma substrate processing system used for forming an insulating film according to the present invention.

1 Substrate
2 Plasma processed CVD film
3 Plasma substrate processing system
11 Processing vessel
11A, 11B Exhaust port
12 Pedestal
13, 15 Dielectric plate
14 Slot plate
16 Cooling plate
16a Cooling medium line
18 Coaxial waveguide
22 Gas nozzle
24 Coolant passage
141 Circular conductive plate
142 Slot
W Semiconductor wafer

DESCRIPTION OF PREFERRED EMBODIMENTS

The embodiments of the present invention will be described below.

Figure 2:
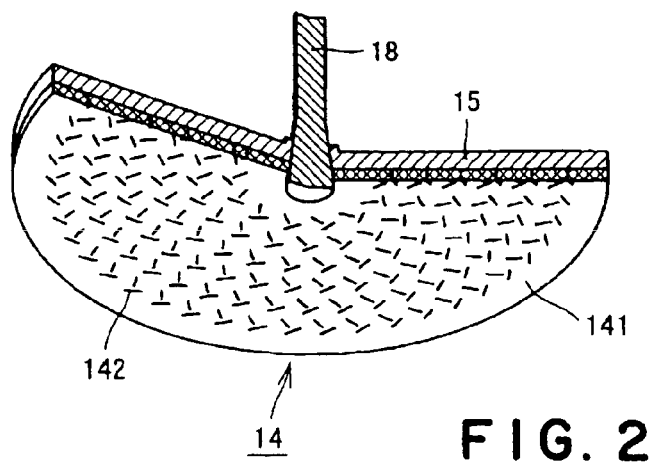
FIG. 2 is a partially-broken perspective view of a slot plate (antenna) shown in FIG. 1.

FIG. 1 is a cross-sectional view of a plasma substrate processing system used for forming an insulating film according to the present invention, and FIG. 2 is a partially-broken perspective view of a slot plate (antenna) shown in FIG. 1.

The plasma substrate processing system 10 includes a processing vessel 11 provided therein with a pedestal 12 for holding a silicon wafer W which is a substrate to be processed. Gases in the processing vessel 11 are discharged therefrom through exhaust ports 11A and 11B by a not shown exhaust pump. The pedestal 12 has a heating function for heating the silicon wafer W.

The upper portion of the processing vessel 11 is provided with an opening so as to oppose the silicon wafer W on the pedestal 12. The opening is closed by a dielectric plate 13 of quartz or aluminum oxide. A slot plate 14 shown in FIG. 2, which functions as a planer antenna, is arranged above (outside) the dielectric plate 13. The slot plate 14 includes a circular conductive plate 141, which is made of a thin copper plate for example. A number of slits 142 are formed in the circular conductive plate 141. When a uniform electromagnetic wave is supplied into the processing vessel 11 through the slits 142 and the dielectric plate 13, a high-density ($10^{11}$ to $10^{13}$/cm) plasma of a low electron temperature (Te is not more than 2 eV) is generated in the processing vessel 11.

A dielectric plate 15, which is made of quartz, alumina or aluminum nitride, is arranged above (outside) the slot plate 14. The dielectric plate 15 is sometimes called "retadation plate" or "wavelength-shortening plate", which reduces the propagation velocity of the microwave to shorten the wavelength thereof, thereby to improve the propagation efficiency of the microwave radiated through the slot plate 14. A cooling plate 16 is arranged above (outside) the dielectric plate 15. The cooling plate 16 is provided therein with a coolant passage 16a through which a cooling medium flows. A concentric waveguide 18 is arranged at the center of the upper end of the processing vessel 11 to introduce the microwave thereto. Gas nozzles 22 are arranged in the inner wall of the vessel 11 to supply a gas. Coolant passages 24 are formed in the outer portion of the inner wall of the processing vessel to surround the whole vessel.

The plasma substrate processing system has plural functional elements for performing plural process steps to process a film. The plural functional elements includes: process gas supplying apparatus 30 (including a gas source, a mass-flow controller, a valve, a gas supply pipe and so on) that supplies the gas nozzle 22 with a process gas such as argon or hydrogen); an exhaust apparatus 32 (including a vacuum pump, an exhaust valve, and exhaust pipe and so on) that discharges an atmosphere in the processing vessel 11; a microwave supplying apparatus 34 (including a microwave generator, a matching circuit, a converter and so on) that supplies the coaxial waveguide 18 with a microwave; and a heater power supply 36 that supplies a not shown heater embedded in the pedestal 12 with electric power. All the functional elements are connected through signal lines 42 to the control computer 40, which automatically controls the whole operations of the plasma substrate processing system 10. For simplicity of the drawing, only the signal lines 42 relating to the functional elements 30, 32, 34 and 36 are indicated.

The control computer 40 includes a central processing unit (CPU) 42, a circuit 44 for supporting the CPU 42, and a storage medium 46 storing control software. Upon execution of the control software, the control computer 40 controls the functional elements of the plasma substrate processing system 10 so that various process conditions (e.g., gas flow rate, process pressure, process temperature, microwave power) defined by a predetermined process recipe are achieved.

The storage medium 46 may be fixedly mounted to the control computer 40. Alternatively, the storage medium 46 may be such that it is removably loaded to a reader mounted to the control computer 40 and is readable by the reader. In the most typical embodiment, the storage medium 46 is a hard disk drive in which the control software is installed by service personnel of the manufacturing company of the plasma substrate processing system. In another embodiment, the storage medium 46 is may be a removable disk such as a CD-ROM or a DVD-ROM in which the control software is written. Such a removable disk is read by an optical reader mounted to the control computer 40. The storage medium 46 may either be a RAM (random access memory) type or a ROM (read only memory) type. Alternatively, the storage medium 46 may be a cassette type ROM or a memory card. In short, any medium known in the technical field of a computer can be employed as the storage medium 46. In a factory where plural plasma substrate processing systems are used, a management computer that performs overall control of the control computers 40 of each of the plasma substrate processing systems may store the control software therein. In this case, the respective plasma substrate processing systems are operated by the management computer via communication lines to perform predetermined processes.

Next, the method of lowering the dielectric constant of an insulating film by using the aforementioned plasma substrate processing system 10 will be described.

<First Method>

Figure 3:
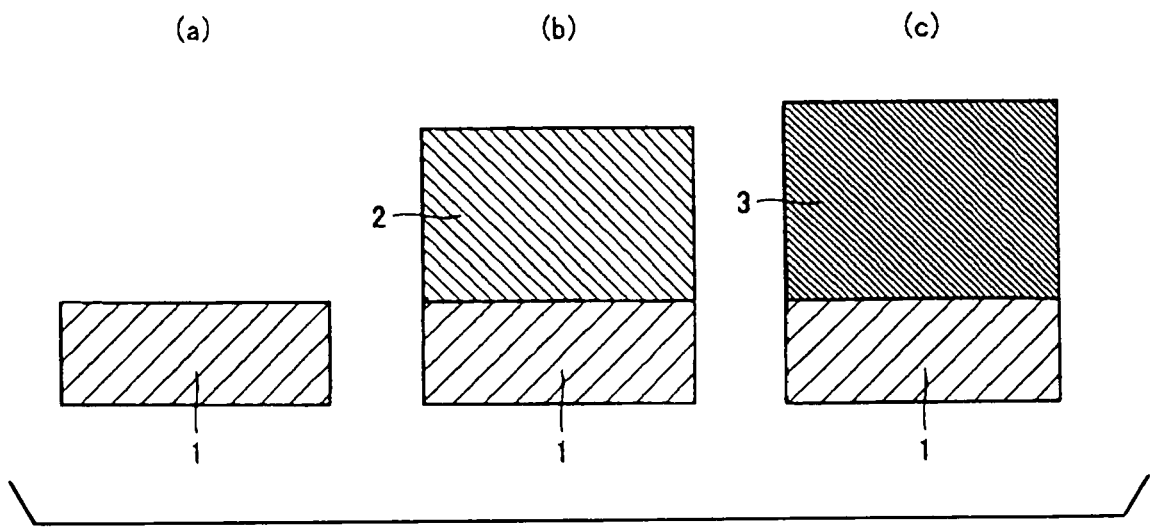
FIG. 3 shows cross-sectional views of an insulating film in one embodiment of the present invention, showing process steps for forming the insulating film.
Figure 4:
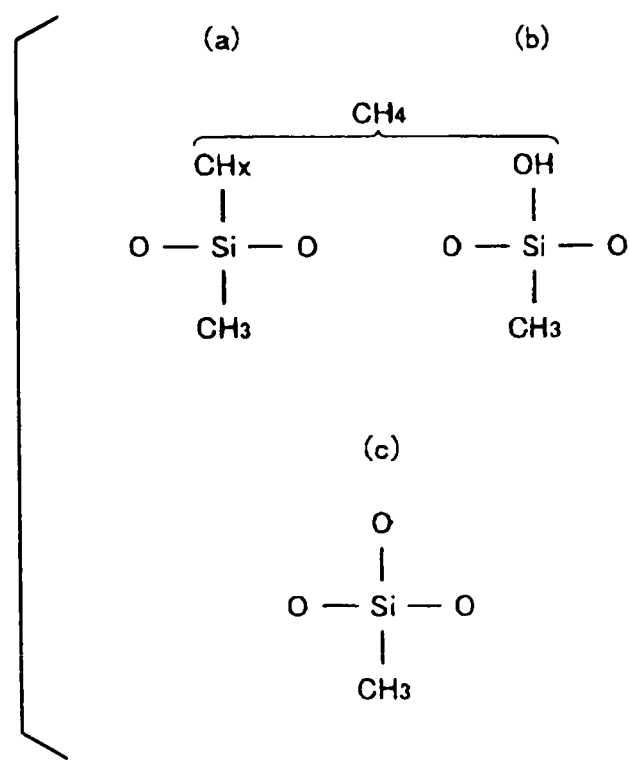
FIG. 4 shows molecular structures of a CVD film before and after subjected to a plasma process.

FIG. 3 shows cross-sectional views of an insulating film in one embodiment of the present invention, which shows process steps for forming the insulating film, (a) and (b) showing the states before processing, and (c) showing the state after processing. FIG. 4 shows molecular structures of the CVD film before and after subjected to a plasma process, (a) and (b) showing the states before processing, and (c) showing the state after processing.

First, a substrate 1 is prepared as shown in FIG. 3(a), and then a CVD film 2 is formed on the substrate 1. The CVD film 2 is an insulating film formed by a low-temperature film forming process performed under a process temperature not higher than 100° C., such as room temperature, and the film contains a relatively large amount of moisture. The CVD film 2 may be formed by using a plasma processing system of a parallel-plate type under the following process conditions, for example.

Process temperature: room temperature
Process pressure: 100 Pa
RF frequency: 27.12 MHz
RF power: 250 W
Electrode gap: 25 mm
Trimethylsilane-vapor flow rate: 100 sccm
$O_2$ gas flow rate: 100 sccm
$N_2$ gas flow rate: 300 sccm
Ar gas flow rate: 300 sccm Certain molecule contained in the CVD film 2 thus formed has a molecular structure in which two methyl groups ($CH_3$, CHx) are bonded to Si of an O—Si—O bond, as shown in FIG. 4(a). Another molecule in the CVD film 2 has a molecular structure in which a hydroxyl group is bonded to Si of an O—Si—O bond, as shown in FIG. 4(b).

The substrate 1, on which the CVD film 2 is formed, is transferred into a processing space S in the plasma substrate processing system 10 shown in FIG. 1 by means of a not shown conveyer. Then, pressure in the plasma substrate processing system 10 is adjusted to 0.05 to 5 Torr, for example; a mixed gas whose Argon/Hydrogen ratio is 1000/100 to 100/1000 is supplied into the processing space S; and a 2.45 GHz-microwave of 2.0 kW is applied to the concentric waveguide 7. Thereby, a high-density plasma of a low electron temperature containing hydrogen radicals is generated in the processing space S. The process temperature of the high-density plasma process is in a range of room temperature to 450° C., for example. The CVD film 2 is irradiated with the high-density plasma for 0.5 to 5 minutes. Due to the use of a plasma of a low electron temperature, ion damage of the insulating film is low, and thus a low-k insulating film of high quality can be obtained.

The high-density plasma containing hydroxyl radicals breaks Si—CHx bonds shown in FIG. 4(a) in certain molecules, and also breaks Si—OH bonds shown in FIG. 4(b) in other molecules. CHx (methyl group) and H element in OH (hydroxyl group) bind together to form methane ($CH_4$), which will disperse, while $CH_3$—Si—O bonds are remained. At this time, the interatomic distance of the Si—O bonds is increased, resulting in expansion of the CVD film. As a molecule in intermolecular bonds in the CVD film 2 is removed, a ladder-type molecular structure is formed, and thereby voids are formed between molecules.

As mentioned above, as the entire CVD film 2 expands so that voids are formed in the film, a CVD film 3 having a low dielectric constant k value such as 2.2 to 2.3 is obtained. The upper portion of the CVD film 3 has denser molecule structure, and thus is harder, as approaching the surface thereof, while the lower portion of the CVD film 3 has a coarse molecule structure.

In order to obtain Si—O bonds having a large interatomic distance, the existence of a larger amount of hydrogen radicals is preferable. As the hydrogen radicals is likely to disappear immediately after the generation thereof, the gap between the wafer W and the quarts plate 13 shown in FIG. 1 is set to be 30 to 134 mm, for example.

The higher pressure results in a larger amount of hydrogen radicals generated by the plasma, while the lower pressure results in a larger amount of ionic particles, which results in a greater damage of the CVD film 2, reduction in the film thickness and a higher dielectric constant.

Figure 5:
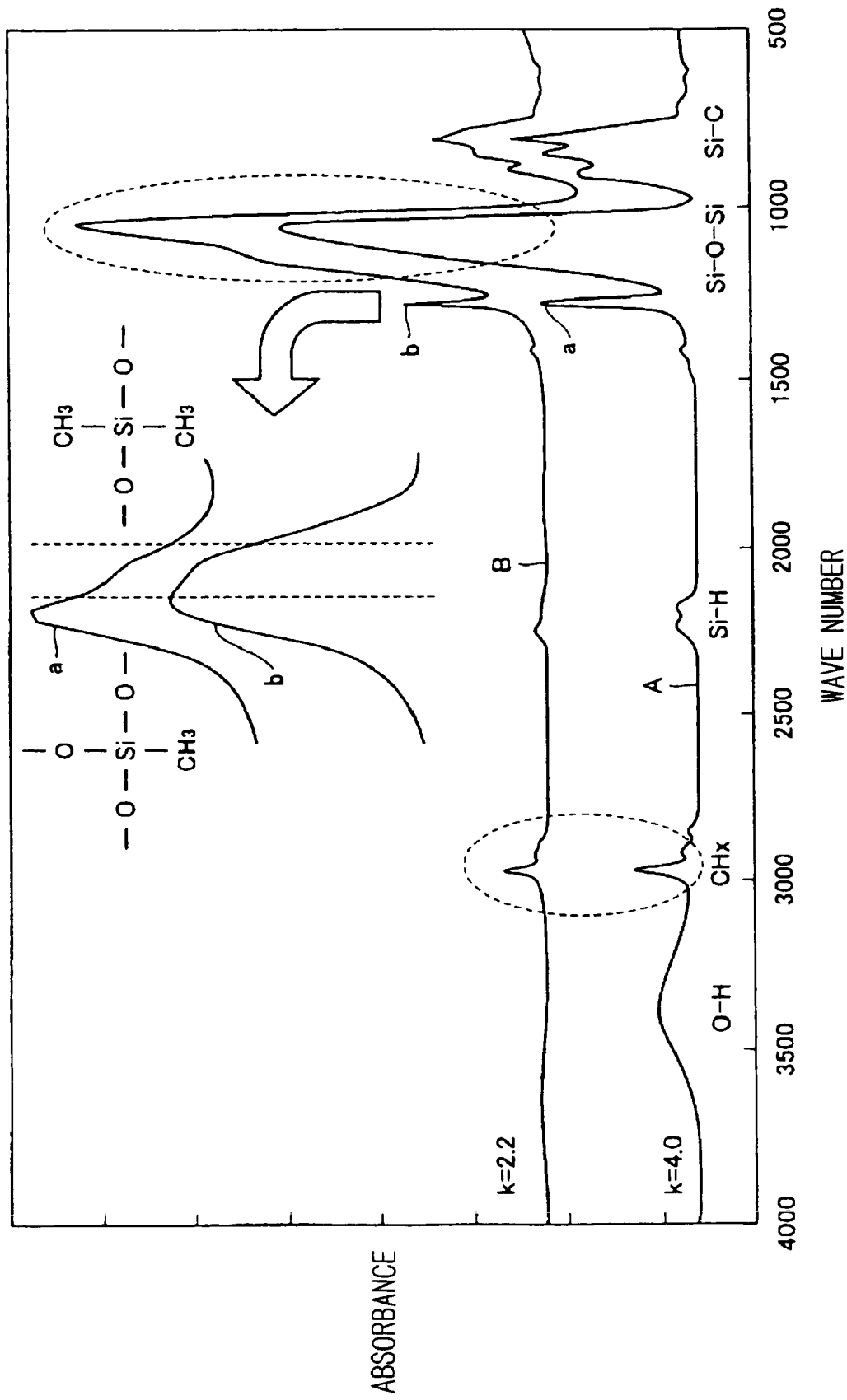
FIG. 5 is a graph showing infrared absorption spectral characteristics of an insulating film before and after subjected to a plasma process, which are measured by using an interference spectrometer.

FIG. 5 is a graph showing infrared absorption spectral characteristics of an insulating film before and after subjected to a plasma process, which were measured by using an interference spectrometer. In FIG. 5, characteristic A shows infrared absorption spectral characteristic before the plasma process, while characteristic B shows that after the plasma process. The CVD film 2 had a high dielectric constant k value of 4.0 before subjected to the plasma process. The characteristic A of the CVD film 2 in the infrared absorption spectral characteristics shows: a broad peak at around a wave number of 3400 indicating the existence of O—H bonds; small peaks at around a wave number of 3000 indicating the existence of CHx; two low peaks at around a wave number of 2200 indicating the existence of Si—H bonds; a sharp peak (a) at around a wave number of 1300 indicating the existence of Si—CH$_3$ bonds; a large peak at around a wave number of 1100 indicating the existence of Si—O—Si bonds; and a sawtooth-shaped peak at around a wave number of 800 indicating the existence of Si—C bonds.

On the other hand, the CVD film 3 after subjected to the plasma process had a low dielectric constant k such as 2.2. The CVD film 3, as shown by characteristic B, had a spectrum in which: the broad peak at around a wave number of 3400 indicating the existence of O—H bonds before the plasma process disappears; the small peaks at around a wave number of 3000 indicating the existence of CHx and the low peak(s) at around a wave number of 2200 indicating the existence of Si—H bonds become smaller; a sharp peak (b) at around a wave number of 1300 indicating the existence of Si—CH$_3$ bonds appears; a peak at around a wave number of 1100 indicating the existence of Si—O—Si bonds appears; and a sawtooth-shaped peak at around a wave number of 800 indicating the existence of Si—C bonds appears. The peak at around a wave number of 1100 indicating the existence of Si—O—Si bonds becomes wider at the rising part thereof, which indicates the formation of a ladder-type structure.

An arrow means that the waveforms of the peaks (a) and (b) of Si—O—Si bonds are shown in an enlarged manner. As is apparent from the enlarged peak waveforms (a) and (b) in comparison with each other, the top end portion of the peak waveform (a) is sharp, while the top end portion of the peak waveform (b) is smooth and the peak position is shifted to the left side, namely the higher-wavenumber side. The shifting of the peak position is resulted from the fact that the number of methyl groups is reduced from two to one, and CH$_3$—Si—O bonds are substituted for CH$_3$—Si—CHx bonds resulting in the change in the skeletal structure, by which the interatomic distance of Si—O bonds is increased. The hydrogen radicals not only effect on the CVD film 2 such that the radicals provide the film with thermal energy, but also effect on the CVD film 2 so as to cause a reaction by means of the electrons of the radicals, and has energy for substituting CH$_3$—Si—O bonds for CH$_3$—Si—CHx bonds.

In the aforementioned first method, the whole insulating film, which is plasma-processed with the use of H$_2$ and Ar, expands, and thus the film thickness is not reduced.

In the foregoing embodiment, a high-density plasma is generated by the plasma substrate processing system 10 employing a microwave, and hydrogen radicals expands the whole CVD film to form pores therein. Alternatively, although a longer process time is required, the process may be carried out by generating a plasma containing hydrogen radicals at ten-odd MHz by using a plasma generating apparatus of a parallel-plate type. The insulating film (CVD film) formed at a low temperature may be deposited, by using, instead of trimethylsilane, an organic silane compound such as dimethylethoxysilane or tetramethylsilane, or an organic silicon alcoxide as a source material and by using a plasma CVD process. The insulating film may be formed not only by using a CVD method but also by coating a substrate with methylsilsesquioxane (MSQ) or porous MSQ.

<Second Method>

Next, the second method of lowering dielectric constant of an insulating film will be described.

Figure 6:
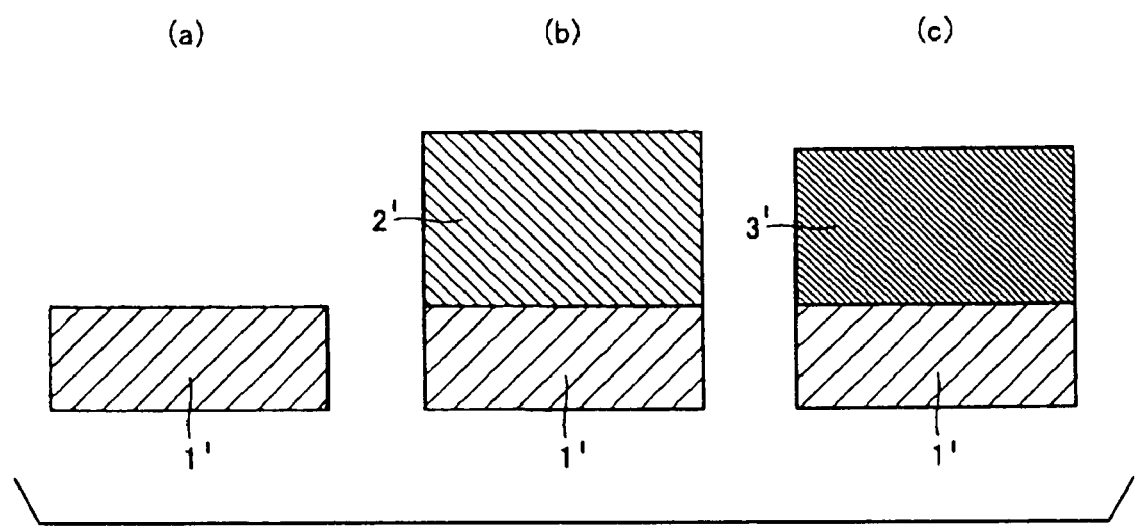
FIG. 6 shows cross-sectional views showing process steps for forming an insulating film in one embodiment of the present invention.

FIG. 6 shows cross-sectional views, which shows process steps for forming an insulating film in one embodiment of the present invention, (a) and (b) showing the states before processing, and (c) showing the state after processing.

First, a substrate 1' is prepared as shown in FIG. 6(a), and then a CVD film 2', which is a SiOCH-series insulating film having a low dielectric constant (k=2.5 to 4), is formed on the substrate 1. The CVD film 2' is deposited at a relatively high process temperature of 300 to 400° C., and has a structure different from that of the CVD film 2 previously described in connection with the first method. The CVD film 2' is a SiOCH-series film containing Si—H bonds and Si—CH$_3$ bonds. Focusing on the dipole moment, the dipole moment of Si—H bond is 0.889 D, while the dipole moment of Si—CH$_3$ bond is 1.563 D. The dipole moment of Si—H bond is smaller than that of Si—CH$_3$ bond.

The substrate 1, on which the CVD film 2' is formed, is transferred into a processing space in the plasma substrate processing system 10 shown in FIG. 1 by means of a not shown conveyer. Then, pressure in the plasma substrate processing system 10 is adjusted to 100 mTorr to 10 Torr, for example; a mixed gas of argon and hydrogen is supplied into the processing space; and a 2.45 GHz-microwave of, for example, 1 to 3 kW is applied to the concentric waveguide 18. Thereby, a high-density plasma of a low electron temperature (Te is not higher than 2 eV) containing hydrogen radicals is generated in the processing space. The process temperature of the high-density plasma process is in a range of 350 to 450° C., for example; and the process time is 60 to 300 sec, for example. Under these conditions, the high-density plasma is generated and is irradiated to the CVD film 2'. Due to the use of a plasma of a low electron temperature, ion-damage of the insulating film is low, and thus a low-k insulating film of high quality can be obtained.

The number of component molecules having a low dipole moment contained in the CVD film 2' is increased to reduce the dielectric constant of the film, by controlling the temperature and the plasma generation so that the CVD film 2' is irradiated with the generated high-density plasma containing hydrogen radicals. It is known that the dipole moment of the dielectric material increases the capacity of the capacitor. Thus, reduction of the dipole moment results in reduction of the dielectric constant.

That is, if the dipole moment of the CVD film 2' is large, polarization is likely to occur, and the dielectric constant of the CVD film 2' is large. If H is substituted for CH$_3$ of Si—CH$_3$ bonds, the amount of Si—H bonds having a small dipole moment is increased while the amount Si—CH$_3$ bonds having a large dipole moment is decreased. As mentioned above, as the dipole moment of Si—CH$_3$ bond is larger than that of Si—H bond, the insulating film, as a whole, is not likely to be polarized, and has a reduced dielectric constant. Thereby, the CVD film 2' has a reduced dielectric constant while it becomes denser (shrink), or is hardened.

In the conventional method, densifying a CVD film results in a higher dielectric constant thereof. In this embodiment, however, voids in the CVD film 3 are reduced as shown in FIG. 6(c) so that the film is hardened while the dielectric constant of the film can be reduced, by substituting Si—H bonds having a small dipole moment for Si—CH$_3$ bonds having a large dipole moment. In the CVD film 3, Si—CH$_3$/Si—O—Si=0.030, or Si—CH$_3$/Si—O—Si=0.028 to Si—H/Si—O—Si=0.028, in peak area ratio obtained by using FT-IR (Fourier Transform Infrared Spectorophotometer).

At the time immediately after the deposition of the CVD film, Si—H/Si—CH$_3$ ratio of the film is 0 or 0.36 in peak area ratio of FT-IR, while Si—H/Si—CH$_3$ ratio of the film becomes 0.75 or 0.44 after subjected to the plasma process.

Figure 7:
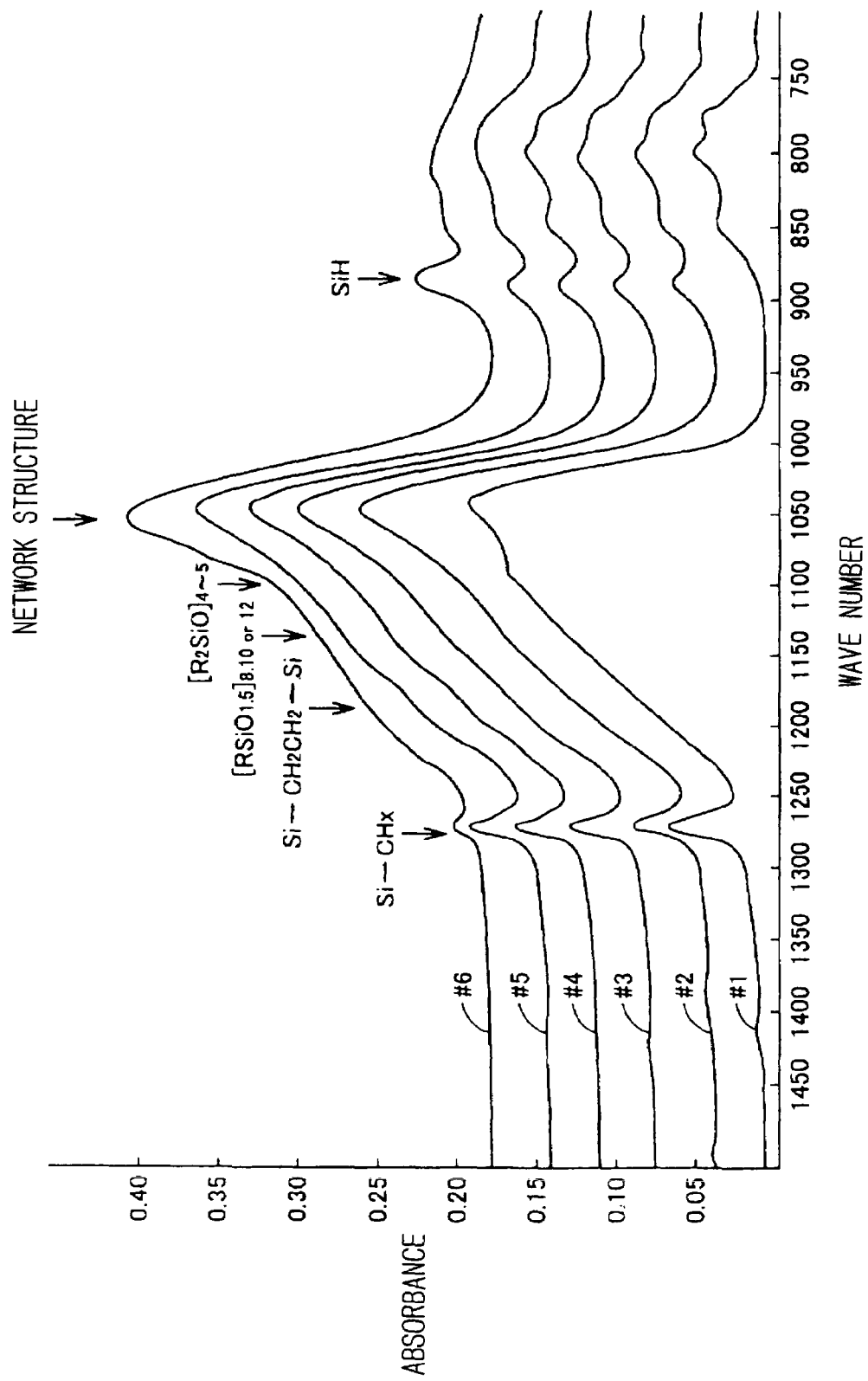
FIG. 7 is a graph showing infrared absorption spectral characteristics of CVD films subjected to a plasma process, which are measured by using an interference spectrometer.

FIG. 7 is a graph showing infrared absorption spectral characteristics of CVD films subjected to a plasma process, which are measured by using an interference spectrometer. FIG. 5 is a table showing process conditions for obtaining the characteristics of FIG. 4.

In FIG. 7, characteristics #1 to #6 respectively show the infrared absorption spectral characteristics of the film which was sequentially subjected to curing processes shown in FIG. 5 cumulatively. Spectral characteristic #1 shows the state of the film before subjected a curing process. A small peak around a wave number of 1280 indicates the existence of a methyl group, Si—CHx. Absorbance is increased in the wavenumber range of about 1250 to about 1040. A wave number of about 1180 corresponds to Si—CH$_2$CH$_2$—Si; a wave number of about 1130 corresponds to [RSiO$_{1.5}$]$_{8, 10\ or\ 12}$; and a wave number of about 1080 corresponds to [R$_2$SiO]$_{4-5}$. The maximal absorbance appears at a wave number of about 1040, which indicates the existence of Si—O—Si network structure. The absorbance sharply drops after the wave number decreases from about 1040. A wave number of about 900 corresponds to Si—H bonds.

As is apparent from characteristic #1, before subjected to a curing process, the peak of a methyl group, Si—CHx is large while the peak of Si—H is small, and thus the dielectric constant of the film is high, since the amount of Si—CHx bonds having a large dipole moment is large while the amount of Si—H bonds having a small dipole moment is small.

Characteristic #2 shows a infrared absorption spectral characteristic after the film was cured under the following conditions: a process pressure of 0.5 Torr; an argon gas flow rate of 1000 sccm; a hydrogen gas flow rate of 100 sccm; an electric power of 2 kW; a process temperature of 350° C., 105-millimeter gap between the silicon wafer W and the dielectric plate 13; and a cure time of 60 sec. Characteristic #3 shows the same after the film was subjected to a curing process under the following conditions: a process pressure of 0.5 Torr; an argon gas flow rate of 1000 sccm; a hydrogen gas flow rate of 100 sccm; an electric power of 2 kW; a process temperature of 400° C., 105-millimeter gap; and a cure time of 60 sec. The film was further cured sequentially and cumulatively under the process conditions corresponding to characteristics #4 and #5 of FIG. 8. As the curing of the film progressed, the absorption becomes larger, while a peak corresponding to Si—H bonds appears.

In order to obtain the film corresponding to characteristic #6, the pressure was increased from 0.5 Torr to 2.0 Torr; the hydrogen gas flow rate is increased; and the gap between the silicon wafer W and the dielectric plate 13 was reduced from 105 mm to 55 mm, thereby further promoting the curing of the film. As a result, the size of the peak corresponding to the methyl group, Si—CHx is reduced; the size of the peaks corresponding to the Si—O—Si network structure and Si—H bonds; and the amount of a cyclic structure of [R$_2$SiO]$_{4-5}$ was decreased while the amount of straight-chain structures was increased.

In the conventional method, decrease of the amount of methyl groups results in increase of the dielectric constant. In this embodiment, however, even if the methyl group, Si—CHx is reduced, the increase of the dielectric constant can be suppressed by increasing the amount of Si—H bonds.

Figure 9:
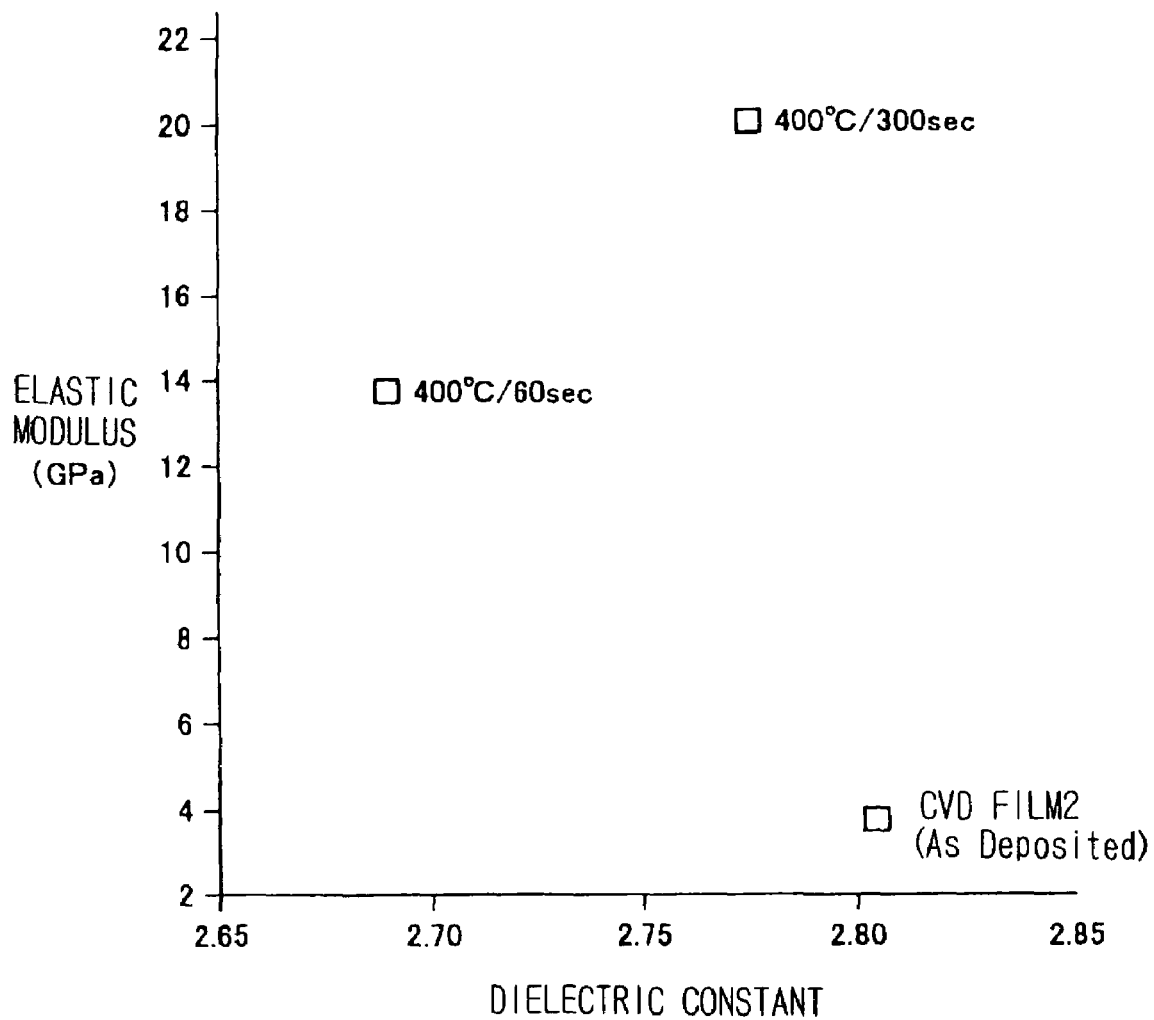
FIG. 9 is a graph showing the relationship between dielectric constant and elastic modulus of films before and after subjected to the low-k insulating film forming method according to the present invention.

FIG. 9 is a graph showing the relationship between dielectric constant and elastic modulus of films before and after subjected to the low-k insulating film forming method according to the present invention. In FIG. 9, a SiOCH-series CVD film 2 as deposited had a dielectric constant of 2.81 and an elastic modulus of about 4 GPa. After the CVD film 2 was exposed to a high-density plasma atmosphere containing hydrogen radicals for 60 sec. with the pedestal temperature being 400° C., the dielectric constant was reduced to 2.69 while the elastic modulus was increased to 14 GPa. After the CVD film 2 was exposed to the high-density plasma atmosphere for 30 sec. with the pedestal temperature being 400° C., the dielectric constant became 2.78 while the elastic modulus became 20.5 GPa.

Thus, it can be seen from FIG. 9 that the dielectric constant of CVD film 2 can be reduced while the elastic modulus of the CVD film 2 can be increased as compared with the film as deposited, by exposing the film to a high-density plasma atmosphere containing hydrogen radicals.

In the foregoing embodiment, the CVD film 2 is irradiated with a high-density plasma containing hydrogen radicals by using the plasma substrate processing system 10. However, not limited thereto, the use of an electron beam generating system is possible. The insulating film (CVD film 2') formed at a low temperature may be formed by using an organic silane compound such as trimethylsilane, dimethylethoxysilane or tetramethylsilane, or an organic silicon alcoxide as a source material and by using a plasma CVD process. The insulating film may be formed not only by using a CVD method but also by coating the substrate with methylsilsesquioxane (MSQ) or porous MSQ.

Embodiments of the present invention has been described with reference to the attached drawings, however, the present invention is not limited to the illustrated embodiments. Various modifications may be made to the illustrated embodiments within a scope of the present invention or within a range of an equivalent of the present invention.

The invention claimed is:

1. A method of forming a low-k insulating film, comprising the steps of:
    placing a substrate, on which an insulating film formed of a silicon alkoxide series material containing CH$_3$—Si—O bonds has been deposited by a chemical vapor deposition process, in a reaction vessel;
    supplying a process gas containing hydrogen atoms into the reaction vessel and supplying a microwave into the reaction vessel, thereby generating a plasma containing hydrogen radicals; and
    modifying a structure of the insulating film deposited on the substrate by means of the hydrogen radicals contained in the plasma, thereby lowering a dielectric constant of the insulating film, wherein
    in the supplying step, as the process gas, hydrogen gas and argon gas are supplied into the reaction vessel with an argon/hydrogen ratio ranging from 1000/100 to 100/1000, and
    the step of lowering the dielectric constant of the insulating film includes a step of increasing an interatomic distance of Si—O bonds in the CH$_3$—Si—O bonds.

2. The method according to claim 1, wherein the step of lowering the dielectric constant of the insulating film includes a step of expanding the insulating film deposited on the substrate by means of the hydrogen radicals contained in the plasma.

3. The method according to claim 2, wherein the step of lowering the dielectric constant of the insulating film includes a step of substituting intermolecular bonds of a long interatomic distance for intermolecular bonds of a short interatomic distance constituting the insulating film.

4. The method according to claim 2, wherein the step of lowering the dielectric constant of the insulating film includes a step of removing a molecule in an intermolecular bond to modify the molecule to be of a ladder-type molecular structure.

5. The method according to claim 2, wherein the step of lowering the dielectric constant of the insulating film includes a step of removing a hydroxyl group from a molecule constituting the insulating film, and removing a methyl group from another molecule constituting the insulating film, and combining an hydrogen element of the hydroxyl thus removed with the methyl group thus removed to disperse a resultant methane, while retaining an oxygen element of the hydroxyl group.

6. The method according to claim 1, wherein the step of lowering the dielectric constant of the insulating film includes a step of increasing an amount of component molecules having a large dipole moment.

7. The method according to claim 6, wherein the step of increasing the amount of component molecules having a large dipole moment includes a step of increasing an amount of Si—H bonds while decreasing an amount of Si—$CH_3$ bonds.

8. The method according to claim 6, wherein the step of increasing the number of component molecules having the large dipole moment includes a step of substituting H for $CH_3$ in a Si—$CH_3$ bond.

9. The method according to claim 1, wherein in the step of generating the plasma, the microwave is introduced into the reaction vessel through a radial-slot antenna comprising a circular disk having a plurality of slits formed therein, whereby a substantially uniform electric field is formed in the reaction vessel.

10. A method of forming a low-k insulating film, comprising the steps of:

placing a substrate, on which an insulating film formed of a silicon alkoxide series material containing $CH_3$—Si—O bonds has been deposited by a chemical vapor deposition process under a process temperature of 100° C. or below, in a reaction vessel;

supplying a process gas containing hydrogen atoms into the reaction vessel and supplying an electromagnetic wave into the reaction vessel, thereby generating a plasma containing hydrogen radicals; and modifying a structure of the insulating film deposited on the substrate by means of the hydrogen radicals contained in the plasma, thereby lowering a dielectric constant of the insulating film wherein in the supplying step, as the process gas, hydrogen gas and argon gas are supplied into the reaction vessel with an argon/hydrogen ratio ranging from 1000/100 to 100/1000, and the step of lowering the dielectric constant of the insulating film includes a step of increasing an interatomic distance of Si—O bonds in the $CH_3$—Si—O bonds.

* * * * *